United States Patent
Koch

(10) Patent No.: US 11,542,591 B2
(45) Date of Patent: Jan. 3, 2023

(54) METHOD FOR PRODUCING COATED SUBSTRATES, COATED SUBSTRATES AND USE THEREOF

(71) Applicant: HEC High End Coating GmbH, Allendorf (DE)

(72) Inventor: Matthias Koch, Bromskirchen (DE)

(73) Assignee: HEC High End Coating GmbH, Allendorf (DE)

( * ) Notice: Subject to any disclaimer, the term of this patent is extended or adjusted under 35 U.S.C. 154(b) by 0 days.

(21) Appl. No.: 16/772,683

(22) PCT Filed: Dec. 13, 2018

(86) PCT No.: PCT/EP2018/084734
§ 371 (c)(1),
(2) Date: Sep. 22, 2020

(87) PCT Pub. No.: WO2019/115682
PCT Pub. Date: Jun. 20, 2019

(65) Prior Publication Data
US 2021/0040599 A1 Feb. 11, 2021

(30) Foreign Application Priority Data
Dec. 13, 2017 (EP) .................... 17207102

(51) Int. Cl.
*C23C 14/20* (2006.01)
*C23C 14/00* (2006.01)

(52) U.S. Cl.
CPC .......... *C23C 14/20* (2013.01); *C23C 14/0015* (2013.01)

(58) Field of Classification Search
CPC ............................ C23C 14/20; C23C 14/0015
See application file for complete search history.

(56) References Cited

U.S. PATENT DOCUMENTS

| 4,911,811 A | 3/1990 | Mullaney, Jr. |
| 5,707,505 A | 1/1998 | Huss |
| 2006/0210813 A1* | 9/2006 | Fath .................. C25D 5/48 |
| | | 428/457 |
| 2014/0329071 A1* | 11/2014 | Meyer .................. B32B 15/08 |
| | | 428/323 |
| 2015/0353773 A1* | 12/2015 | Dornseif ................ C23C 22/74 |
| | | 204/192.15 |
| 2017/0291680 A1* | 10/2017 | Uprety .................. C03C 17/42 |
| 2019/0255563 A1 | 8/2019 | Koch |

FOREIGN PATENT DOCUMENTS

| DE | 39 13 014 A1 | 1/1990 |
| DE | 38 33 119 C2 | 9/1990 |
| DE | 195 44 906 A1 | 5/1997 |
| DE | 103 20 765 A1 | 11/2004 |
| DE | 20 2007 016 072 U1 | 2/2008 |
| DE | 2 412 445 A1 | 2/2012 |
| DE | 2 886 250 A1 | 6/2015 |
| DE | 3 225 717 A1 | 10/2017 |

OTHER PUBLICATIONS

International Search Report for Application No. PCT/EP2018/084734, 4 pages.

* cited by examiner

*Primary Examiner* — Kelly M Gambetta
(74) *Attorney, Agent, or Firm* — Seed Intellectual Property Law Group LLP

(57) ABSTRACT

The present invention relates to a method for producing a coated metallic or non-metallic substrate, to the coated substrate obtainable in particular by the method according to the invention, and to the use of the coated substrates according to the invention.

32 Claims, No Drawings

METHOD FOR PRODUCING COATED SUBSTRATES, COATED SUBSTRATES AND USE THEREOF

BACKGROUND

Technical Field

The present disclosure relates to a method for producing coated substrates, coated substrates and the use of said coated substrates.

Description of the Related Art

Metallic and non-metallic components are frequently coated in order to create a smooth and/or shiny surface. Generally, these are multi-layer coating systems. In addition to the desire to obtain a surface with a high-quality appearance, the aim with such coating systems is generally also to obtain excellent corrosion protection. Permanent corrosion protection is not infrequently destroyed by mechanical damage. In many cases, there is already an onset of corrosion with low-level mechanical damage to coated surfaces. In addition to discoloration, this can also result in infiltration phenomena. It is not unusual for this to lead to spalling of sections of the coating. There has been no shortage of attempts made to render coated, shiny surfaces corrosion-proof. For example, DE 103 20 765 C1 describes a method for producing a corrosion protection layer on a metallic surface, in which a sol based on silicone compounds, an aminoalkyl-functionalized alkoxysilane or a conversion product of the two aforementioned components is used.

According to DE 38 33 119 C2, a corrosion-protected chromated metal surface that adheres very well to a substrate is obtained when an electrodeposition finish is applied directly to the chromating layer without intermediate drying.

In many cases, attempts are made to solve the problem or corrosion protection or the creation of smooth coated surfaces by increasing the material deposition, i.e., the layer thickness, for individual layers or even for several layers of a coating system. This not only leads to an increase in the utilized quantity, the amount of work involved and the costs, but, in addition, unwanted material deposition frequently occurs in the marginal or edge area of components.

For metal substrates in particular, there is still significant room for improvement for corrosion protection coatings with regard to visual appearance, adhesion and corrosion protection, in particular for mass produced products, most of all those with a challenging geometry.

In many cases, it is also not of minor importance that substrate surfaces with a high-quality appearance are reproducibly created in a simple, low-cost manner in mass production. Such surfaces usually require the use of electroplating technology. In order to obtain so-called black chromed coatings, which frequently have an elegant appearance, even greater effort is involved, since for this purpose, an increased current density is required in combination with special additives.

BRIEF SUMMARY

There has therefore been a need to provide coated substrates that no longer suffer from the disadvantages of the prior art, and which in some cases provide products that are also coated in mass production with improved corrosion protection and/or very good adhesion properties and/or high-quality surface properties. There has also been a need to provide coated products that do not immediately show infiltration problems if mechanical surface damage occurs, particularly not such problems related to the flaking off of layers. Furthermore, there has been a need to attain coated substrates that present a uniformly high coating result over the entire component, including in the area around edge contours, even in the case of complex geometry.

Accordingly, a method was developed for producing a coated metallic substrate or a coated non-metallic substrate, in some cases a plastic substrate, comprising:

a) providing a metallic substrate or a non-metallic substrate, in some cases a plastic substrate, with at least one at least partially coatable surface, b) providing an application system for depositing a metal layer, in some cases a vacuum steam system or sputter system, and providing at least one plasma generator and/or at least one corona system, in some cases in the application system for depositing a metal layer, such as a vacuum steam system or sputter system, or as a component thereof, c) optionally, cleaning the at least one at least partially coatable surface, d) optionally, loading the metallic substrate or the non-metallic substrate, in some cases the plastic substrate, or the coatable surface of the metallic substrate or the non-metallic substrate, in some cases of the plastic substrate, with a vacuum (d1)) and/or plasma treatment with the plasma generator or corona treatment, in some cases plasma treatment, of the metallic substrate or the non-metallic substrate, in some cases of the plastic substrate, or of the coatable surface of the non-metallic substrate, in some cases of the plastic substrate, or of the metallic substrate, in some cases under vacuum (d2)), e) optionally, treating the metallic substrate or non-metallic substrate, in some cases the plastic substrate, obtained according to step a), c) or d), in some cases d1) and d2), or the coatable surface of the metallic substrate or non-metallic substrate, in some cases the plastic substrate obtained according to step a), c) or d), in some cases d1) and d2), with at least one organic silicone compound, in some cases by way of plasma polymerization, in some cases forming a polysiloxane layer, f) optionally, plasma treatment with the plasma generator or corona treatment, in some cases plasma treatment, of the layer, in some cases the polysiloxane layer, according to step e), g) optionally, depositing at least one primer layer onto the metallic substrate or the non-metallic substrate, in some cases the plastic substrate, or the coatable surface of the metallic substrate or non-metallic substrate, in some cases of the plastic substrate, according to step a), c) or d), in some cases d1) and d2), or onto the layer, in some cases the polysiloxane layer, according to step e) or f)

h) optionally, applying the metallic substrate or the non-metallic substrate, in some cases the plastic substrate, or the coatable surface of the metallic substrate or non-metallic substrate, in some cases of the plastic substrate, according to step g) with a vacuum (h1)) and/or plasma treatment with the plasma generator or corona treatment, in some cases plasma treatment, of the metallic substrate or the non-metallic substrate, in some cases of the plastic substrate, or of the coatable surface of the non-metallic substrate, in some cases of the plastic substrate, or of the metallic substrate according to step h1) or step g), in some other cases under vacuum (h2)), i) optionally, treating the primer layer obtained according to step g) or h), in some cases h1) and h2), with at least one organic silicone compound, in some cases by way of plasma polymerization, in some cases forming a polysiloxane layer, j) optionally, plasma treatment with the plasma generator or corona treatment, in some cases plasma treatment, of the layer, in some cases the polysiloxane layer, according to step i), k) depositing at least one metal layer, containing or consisting of one first metal selected from the group consisting of aluminum, silver, gold, lead, vanadium, manganese, magnesium, iron, cobalt, nickel, copper, chromium, palladium, molybdenum, tungsten, platinum, titanium, zirconium and zinc, in some cases aluminum, or containing or consisting of a first metal alloy selected from the group consisting of brass, bronze, steel, in some cases stainless steel, aluminum, magnesium and titanium alloys, with the application system, in some cases by way of vapor deposition and/or sputter technology, onto the non-metallic substrate, in some cases the plastic substrate, or onto the coatable surface of the non-metallic substrate, in some cases of the plastic substrate, according to step a), c) or d), in some cases d1) and d2), or onto the layer, in some cases the polysiloxane layer, according to step e) or f), or onto the primer layer according to step g) or h), in some cases h1) and h2), or onto the layer, in some cases the polysiloxane layer, according to step i) or j), l) optionally, plasma treatment with the plasma generator or corona treatment, in some cases plasma treatment, of the first metal layer according to step k), m) in some cases treating the first metal layer obtained according to step k) or l) with at least one organic silicone compound, in some cases by way of plasma polymerization, in some cases forming a polysiloxane layer;

n) in some cases plasma treatment with the plasma generator or corona treatment, in some cases plasma treatment, of the layer, in some cases the polysiloxane layer, according to step m), o) depositing at least one, optionally dyed, primer layer onto the layer, in some cases the polysiloxane layer, according to step n), p) loading the primer layer according to step o) with a vacuum (p1)) and/or plasma treatment of the primer layer, in some cases under vacuum, with the plasma generator under vacuum or corona treatment, in some cases plasma treatment (p2));

q) depositing at least one second metal layer, containing or consisting of one first metal selected from the group consisting of aluminum, silver, gold, lead, vanadium, manganese, magnesium, iron, cobalt, nickel, copper, chromium, palladium, molybdenum, tungsten, platinum, titanium, zirconium and zinc, in some cases aluminum, or containing or consisting of a first metal alloy selected from the group consisting of brass, bronze, steel, in some cases stainless steel, aluminum, magnesium and titanium alloys, with the application system, in some cases by way of vapor deposition and/or sputter technology, in some cases directly onto the plasma- or corona-treated, in some cases plasma-treated, primer layer according to step p), in some cases p1) and p2);

r) optionally, plasma treatment, in some cases under vacuum, with the plasma generator or corona treatment, in some cases plasma treatment, of the second metal layer according to step q);

s) in some cases treating the second metal layer obtained according to step q) or r) with at least one organic silicone compound, in some cases by way of plasma polymerization, in some cases forming a polysiloxane layer;

t) in some cases plasma treatment, in some other cases under vacuum, with the plasma generator or corona treatment, in some cases plasma treatment, of the layer, in some cases the polysiloxane layer, according to step s); and u) depositing at least one, in some cases transparent and/or dyed, cover layer onto the treated layer, in some cases the polysiloxane layer, according to step t).

DETAILED DESCRIPTION

In at least one embodiment, the method according to the present disclosure comprises the following steps:

a) providing a metallic substrate or a non-metallic substrate, in some cases a plastic substrate, with at least one at least partially coatable surface, b) providing an application system for depositing a metal layer, in some cases a vacuum steam system or sputter system, and providing at least one plasma generator, in some cases in the application system for the application of a metal layer, such as a vacuum steam system or sputter system, or as a component thereof c) optionally, cleaning the at least one at least partially surface, d) loading the metallic substrate or the non-metallic substrate, in some cases the plastic substrate, or the coatable surface of the metallic substrate or the non-metallic substrate, in some cases of the plastic substrate, with a vacuum (d1)) and/or plasma treatment with the plasma generator or corona treatment, in some cases plasma treatment, of the metallic substrate or the non-metallic substrate, in some cases of the plastic substrate, or of the coatable surface of the non-metallic substrate, in some cases of the plastic substrate, or of the metallic substrate, in some cases under vacuum (d2)), e) optionally, treating the metallic substrate or non-metallic substrate, in some cases the plastic substrate, obtained according to step a), c) or d), in some cases d1) and d2), or the coatable surface of the metallic substrate or non-metallic substrate, in some cases the plastic substrate obtained according to step a), c) or d), in some cases d1) and d2), with at least one organic silicone compound, in some cases by way of plasma polymerization, in some cases forming a polysiloxane layer, f) optionally, plasma treatment with the plasma generator of the layer, in some cases the polysiloxane layer, according to step e), g) optionally, depositing at least one primer layer onto the metallic substrate or the non-metallic substrate, in some cases the plastic substrate, or the coatable surface of the metallic substrate or non-metallic substrate, in some cases of the plastic substrate, according to step a), c) or d), or onto the layer, in some cases the polysiloxane layer, according to step e) or f), h) optionally, plasma treatment with the plasma generator of the primer layer according to step g), i) optionally, treating the primer layer obtained according to step g) or h) with at least one organic silicone compound, in some cases by way of plasma polymerization, in some cases forming a polysiloxane layer, j) optionally, plasma treatment with the plasma generator of the layer, in some cases the polysiloxane layer, according to step i), k) depositing at least one metal layer, containing or consisting of one first metal selected from the group consisting of aluminum, silver, gold, lead, vanadium, manganese, magnesium, iron, cobalt, nickel, copper, chromium, palladium, molybdenum, tungsten, platinum, titanium, zirconium and zinc, in some cases aluminum, or containing or consisting of a first metal alloy selected from the group consisting of brass, bronze, steel, in some cases stainless steel, aluminum, magnesium and titanium alloys, with the application system, in some cases by way of vapor deposition and/or sputter technology, onto the non-metallic substrate, in some cases the plastic substrate, or onto the coatable surface of the non-metallic substrate, in some cases of the plastic substrate, according to step a), c) or d), or onto the layer, in some cases the polysiloxane layer, according to step e) or f), or onto the primer layer according to step g) or h), or onto the layer, in some cases the polysiloxane layer, according to step i) or j), l) optionally, plasma treatment with the plasma generator of the first metal layer according to step k), m) treating the first metal layer obtained according to step k) or l) with at least one organic silicone compound, in some cases by way of plasma polymerization, in some cases forming a polysiloxane layer, n) plasma treatment with the plasma generator of the layer, in some cases the polysiloxane layer, according to step m), o) depositing at least one, optionally dyed, primer layer onto the layer, in some cases the polysiloxane layer, according to step n), p) loading the primer layer according to step o) with a vacuum and plasma treatment of the primer layer with the plasma generator under vacuum, q) depositing at least one second metal layer, containing or consisting of one first metal selected from the group consisting of aluminum, silver, gold, lead, vanadium, manganese, magnesium, iron, cobalt, nickel, copper, chromium, palladium, molybdenum, tungsten, platinum, titanium, zirconium and zinc, in some cases aluminum, or containing or consisting of a first metal alloy selected from the group consisting of brass, bronze, steel, in some cases stainless steel, aluminum, magnesium and titanium alloys, with the application system, in some cases by way of vapor deposition and/or sputter technology, in some cases directly onto the plasma-treated primer layer according to step p), r) optionally, plasma treatment with the plasma generator of the second metal layer according to step q), s) treating the second metal layer obtained according to step q) or r) with at least one organic silicone compound, in some cases by way of plasma polymerization, in some cases forming a polysiloxane layer, t) plasma treatment with the plasma generator of the layer, in some cases the polysiloxane layer, according to step s), and u) depositing at least one, in some cases transparent and/or dyed, cover layer onto the treated layer, in some cases the polysiloxane layer, according to step t).

In one practical embodiment of the method according to the present disclosure, in addition to steps a) and b), and optionally c), said method additionally comprises the sequence of steps d), in some cases d1) and d2), k), o), p), q) and u), wherein these follow on from each other, in some cases directly, in some cases excluding steps g), h), i) and j).

Furthermore, the method according to the present disclosure comprises embodiments that are in some cases suitable in which steps d), k), n), o), p), q) and u) or steps d), k), o), p), q), t) and u) or steps d), k), n), o), p), q), t) and u) or steps d), k), m), n), o), p), q), t) and u) or steps d), k), n), o), p), q), s), t) and u) or steps d), k), m), n), o), p), q), s), t) and u) respectively follow one another, in some cases directly, in some cases excluding steps g), h), i) and j).

According to suitable embodiments of the method according to the present disclosure, it can also be provided that in each case, steps g), k), n), q), s), t) and u), in some cases excluding steps d) to i), j), l), m), o), p) and r), or steps g), h), in some cases h1) and h2), k), n), q), s), t) and u), in some cases excluding steps d) to f), i), j), l), m), o), p) and r), or steps d), in some cases d1) and d2), k), m), n), q), s), t) and u), in some cases excluding steps e) to j), l), o), p) and r) or excluding steps e) to j), l), and r), steps d), in some cases d1) and d2), k), o), p), in some cases p1) and p2), q) and u), in some cases excluding steps e) to j), l), m), n) and r), or excluding steps e) to j), l), m), n), r), s) and t), or, steps d), in some cases d1) and d2), k), n), o), p), in some cases p1) and p2), q) and u), in some cases excluding steps e) to j), l), m) and r) or excluding steps e) to j), l), m), r), s) and t), or steps d), in some cases d1) and d2), k), o), p), in some cases p1) and p2), q), t) and u) in some cases excluding steps e) to j), l), m), n), r) and s), or steps d), in some cases d1) and d2), k), n), o), p), in some cases p1) and p2), q), t) and u), in some cases excluding steps e) to j), l), m), r) and s), or steps d), in some cases d1) and d2), k), m), n), o), p), in some cases p1) and p2), q), t) and u), in some cases excluding steps e) to j), l), r) and s), or steps d), in some cases d1) and d2), k), n), o), p), in some cases p1) and p2 q), s), t) and u), in some cases excluding steps e) to j), l), m) and r), or steps d), in some cases d1) and d2), k), m), n), o), p), in some cases p1) and p2), q), t) and u), in some cases excluding steps e) to j), l) and r), follow one another, in some cases directly.

For some applications, a method of the present disclosure further comprises alongside method steps a), b) and c) also method steps d), k), o), p), q) and u) or steps d), k), n), o), p), q), t) and u), wherein in at least one embodiment, in each case prior to the step of applying the first and/or second metal layer k) or q), the application of a, in some cases plasma-generated, polysiloxane layer, can be provided.

A treatment or a deposition/coating onto "d1) and d2)", or "in some cases d1) and d2)" according to the present disclosure is intended to mean that the deposition/treatment/coating is conducted according to step d2) and that step d1) precedes step d2). The combination of features d1) and d2) should in this case be regarded as a single unit. Accordingly, this does not mean that the application should be conducted according to both step d1) and step d2). The same applies to features "h1) and h2)" and "p1) and p2)".

In at least one appropriate embodiment, in some cases as specified above, the layer onto which the first metal layer is applied according to step k) and/or the layer onto which the second metal layer is applied according to step q) is subjected to a plasma treatment with the plasma generator prior to step k) or prior to step q).

The present disclosure also provides in some cases a method, comprising the following steps:

a) providing a metallic substrate or a non-metallic substrate, in some cases a plastic substrate, with at least one at least partially coatable surface, b) providing an application system for depositing a metal layer, in some cases a vacuum steam system or sputter system, and providing at least one plasma generator, in some cases in the application system for depositing a metal layer, such as a vacuum steam system or sputter system, or as a component thereof, c) optionally, cleaning the at least one at least partially coatable surface, d) loading the metallic substrate or the non-metallic substrate, in some cases the plastic substrate, or the coatable surface of the metallic substrate or the non-metallic substrate, in some cases of the plastic substrate, with a vacuum and/or plasma treatment with the plasma generator or corona treatment, in some cases plasma treatment, of the metallic substrate or the non-metallic substrate, in some cases of the plastic substrate, or of the coatable surface of the non-metallic substrate, in some cases of the plastic substrate, or of the metallic substrate, in some cases under vacuum, e) optionally, treating the metallic substrate or non-metallic substrate, in some cases the plastic substrate, obtained according to step a), c) or d), or the coatable surface of the metallic substrate or non-metallic substrate, in some cases of the plastic substrate with at least one organic silicone compound, in some cases by way of plasma polymerization, in some cases forming a polysiloxane layer, f) optionally, plasma treatment with the plasma generator of the layer, in some cases the polysiloxane layer, according to step e), g) optionally, depositing at least one primer layer onto the metallic substrate or the non-metallic substrate, in some cases the plastic substrate, or the coatable surface of the metallic substrate or non-metallic substrate, in some cases of the plastic substrate, according to step a), c) or d), or onto the layer, in some cases the polysiloxane layer, according to step e) or f), h) optionally, plasma treatment with the plasma generator of the primer layer according to step g), i) optionally, treating the primer layer obtained according to step g) or h) with at least one organic silicone compound, in some cases by way of plasma polymerization, in some cases forming a polysiloxane layer j) optionally, plasma treatment with the plasma generator of the layer, in some cases the polysiloxane layer, according to step i), k) depositing at least one metal layer, containing or consisting of one first metal selected from the group consisting of aluminum, silver, gold, lead, vanadium, manganese, magnesium, iron, cobalt, nickel, copper, chromium, palladium, molybdenum, tungsten, platinum, titanium, zirconium and zinc, in some cases aluminum, or containing or consisting of a first metal alloy selected from the group consisting of brass, bronze, steel, in some cases stainless steel, aluminum, magnesium and titanium alloys, with the application system, in some cases by way of vapor deposition and/or sputter technology, onto the non-metallic substrate, in some cases the plastic substrate, or onto the coatable surface of the non-metallic substrate, in some cases of the plastic substrate, according to step a), c) or d), or onto the layer, in some cases the polysiloxane layer, according to step e) or f), or onto the primer layer according to step g) or h), or onto the layer, in some cases the polysiloxane layer, according to step i) or j), l) optionally, plasma treatment with the plasma generator of the first metal layer according to step k), m) treating the first metal layer obtained according to step k) or l) with at least one organic silicone compound, in some cases by way of plasma polymerization, in some cases forming a polysiloxane layer, n) plasma treatment with the plasma generator of the layer, in some cases the polysiloxane layer, according to step m), o) depositing at least one, optionally dyed, primer layer onto the layer, in some cases the polysiloxane layer, according to step n), p) loading the primer layer according to step o) with a vacuum and plasma treatment of the primer layer with the plasma generator under vacuum, q) depositing at least one second metal layer, containing or consisting of one first metal selected from the group consisting of aluminum, silver, gold, lead, vanadium, manganese, magnesium, iron, cobalt, nickel, copper, chromium, palladium, molybdenum, tungsten, platinum, titanium, zirconium and zinc, in some cases aluminum, or containing or consisting of a first metal alloy selected from the group consisting of brass, bronze, steel, in some cases stainless steel, aluminum, magnesium and titanium alloys, with the application system, in some cases by way of vapor deposition and/or sputter technology, in some cases directly onto the plasma-treated primer layer according to step P), r) optionally, plasma treatment with the plasma generator of the second metal layer according to step q), s) treating the second metal layer obtained according to step q) or r) with at least one organic silicone compound, in some cases by way of plasma polymerization, in some cases forming a polysiloxane layer, t) plasma treatment with the plasma generator of the layer, in some cases the polysiloxane layer, according to step s), and u) depositing at least one, in some cases transparent and/or dyed, cover layer onto the treated layer, in some cases the polysiloxane layer, according to step t).

For this method variant, steps e) and f) and i) and j) are only optional. In individual cases, in some cases when steps e) and f) and/or steps i) and j) are conducted together, they can contribute to even better adhesion and even greater corrosion protection. The same also applies to the optional step i).

For some applications of the method according to the present disclosure, it has been shown that it is advantageous when a, in some cases plasma-generated, polysiloxane layer is present on both sides of the first metal layer and/or both sides of the second metal layer, in some other cases on both sides of the first metal layer and on both sides of the second metal layer, which has in some cases been subjected in each case to a plasma treatment or a corona treatment, in some other cases a plasma treatment.

In step o), and optionally in step g), the method according to the present disclosure comprises the deposition of a primer layer. As a result, uneven areas of lower-quality substrates to be coated, for example, can be leveled. It has surprisingly been shown that through the application of the primer layer onto the first metal layer according to step k), in some cases when it has been plasma treated in advance, in some other cases in the presence of argon, and equipped with one layer formed from organic silicone compounds, in some cases a polysiloxane layer (steps m) and n)), the quantity of coating material for the primer layer can be significantly reduced, wherein at the same time, a fully covering deposition is always achieved. Without being bound to a theory, it is assumed that this could be due to surface tension phenomena. At the same time, a very even distribution of the liquid coating material is obtained. Additionally, it was surprisingly found that in the method according to the present disclosure, the step of depositing the primer layer, in some cases in step o), can be deposited by way of electrostatic finishing. This leads to a further reduction in the quantity of coating material required for the primer layer. In this way, too, a very even coating application can be secured. Furthermore, in this manner, so-called all-round finishing can be achieved far more effectively, i.e., those areas are also coated that are not accessible, or only accessible to a limited extent, via direct spraying application. A person skilled in the art will be familiar with the electrostatic finishing method. With the method according to the present disclosure, the applied metal layer, for example the aluminum layer, can be used, e.g., to apply the required voltage. Thus, in at least one embodiment, for example, a positive electrode can be applied to the substrate coated with the metal layer, and a negative electrode can be applied to a spray device. In this manner, the spray jet is electrically charged accordingly.

It has been shown to be advantageous when the above method steps are essentially left to follow on from each other in succession. This means in some cases that after the plasma treatment steps, a longer storage period should be avoided. To a far greater extent, it is advantageous when the subsequent method step follows on directly. It has also been shown that alongside the above method steps, it is not absolutely necessary to insert additional method steps in between.

Suitable non-metallic substrates comprise glass, ceramic, stone materials, compound fiber materials, carbon materials, plastic or wood. The method according to the present disclosure described here is suitable for coating plastic substrates for the purpose of obtaining permanent high-gloss products. Suitable plastic substrates comprise or consist of, e.g., PVC, polyurethanes, polyacrylates, polyesters, e.g., PBT and PET, polyolefins, in some cases polypropylene, polycarbonates, polyamides, polyphenylene ethers, polystyrene, styrene (co-)polymers, such as ABS, e.g., Galvano-ABS, SAN, ASA or MASS, polyoxylalkylenes, e.g., POM, Teflon and polymer blends, in some cases ABS/PPE-, ASA/PPE-, SAN/PPE- and/or ABS/PC blends.

For the metal substrates, metals and metal alloys can be utilized, where in some cases suitable metal substrates can be selected from the group consisting of aluminum, aluminum alloys, iron, iron alloys, in some cases steel or stainless steel, copper, copper alloys, titanium, titanium alloys, zinc, zinc alloys, nickel, nickel alloys, molybdenum, molybdenum alloys, magnesium, magnesium alloys, lead, lead alloys, tungsten, tungsten alloys, manganese, manganese alloys, brass, bronze, nickel pressure casting, zinc pressure casting and aluminum pressure casting or any mixtures thereof.

Suitable methods for cleaning metal substrates are known to persons skilled in the art. Such cleaning methods comprise degreasing, etching, phosphating, in some cases iron and/or zinc phosphating, polishing, grinding, in some cases slide grinding, and/or treatment with dry ice. These methods can be used both individually and in any combination required. For many applications, it had been shown to be sufficient when the metal substrates were cleaned through treatment with dry ice and/or were degreased. In many cases, degreasing is already sufficient. Without being bound to a theory, it is currently assumed that with the method steps described below of the method according to the present disclosure, sufficient sealing or finishing of the substrate surface is achieved. When cleaning with dry ice, dry ice particles in the form of pellets or in the form of crystals that have been scraped off a corresponding dry ice block are generally accelerated with the aid of compressed air and guided onto the metal surface to be cleaned. Here, the cleaning effect should be due to thermal, kinetic and phase conversion effects. Devices and methods for cleaning metal surfaces with dry ice are described, for example, in DE 195 44 906 A1 and EP 2 886 250.

The surface of metal substrates can be degreased with alkaline or acid reagents, for example. Commercial degreasing steps are also known as soak cleaning or pickling degreasing. Alternatively, a metal surface can be anodically degreased in an electrolyte degreasing bath.

For some embodiments, it is advantageous when the, in some cases degreased, metal substrate surface is subjected to at least one etching step. In order to etch the metal substrate surface, an acid rinsing bath is used, for example. Accordingly, a suitable etching solution is, e.g., diluted hydrochloric acid (1:10 vol/vol). As a result, an essentially oxide-free metal surface is generally obtained through etching. In the same way as the degreasing step, the etching step is generally completed with a rinsing step. If the metal substrate surface is polished and/or ground, or in some cases slide ground, the degreasing and/or etching step can frequently be omitted. Usually, with this type of surface treatment, sufficient material is removed from this surface, as a result of which impurities or other elements that lie on or adhere to the surface are also removed. If the surface is polished or ground, in some cases slide ground, in addition, the deposition of a first and possibly second primer layer may frequently be omitted. With polishing or grinding, an even or smooth surface of mostly obtained such that a smoothing through depositing a primer layer is no longer necessary. However, if the metal substrate has numerous angles and corners that cannot easily be sufficiently polished or ground, it can be advisable to subsequently conduct a first, and possibly also a second priming step.

Following or instead of the degreasing step, the metallic substrate surface can be phosphated and/or passivated. This is a suitable approach for substrates made of or containing aluminum.

In order to deposit a primer layer according to the method according to the present disclosure, a person skilled in the art will have generally known methods available. Examples of such methods are the wet finish method, the powder coating method or deposition using UV-hardened coating systems. Accordingly, in at least one embodiment, the primer layer can originate in some cases from UV-hardened, powder polyester resin compounds or epoxy/polyester powder. The result is surprising in that UV-hardened coatings, such as primer coatings, regularly harden to form very hard layers, and are difficult to access for further manipulation and/or tend to form cracks. Naturally, it is also possible to mechanically smooth the metal substrate surface, for example by way of grinding and/or polishing or slide grinding, as described above, prior to application of a primer layer.

Suitable organic silicone compounds are known to persons skilled in the art. In one appropriate embodiment, at least one amino-containing silane is used for this purpose, in some cases aminopropyltriethoxysilane, hexamethyldisiloxane, tetramethyldisiloxane or any mixtures of these. In some other cases, hexamethyldisiloxane and tetramethyldisiloxane are used, wherein hexamethyldisiloxane is generally suitable in some further cases.

Suitable organic silicone compounds also comprise compounds with the following formula (I) as monomer or comonomer components:

$$X - R_1 - Si(R_2)_{3-m}(R_3)_m, \qquad (I)$$

wherein the substituents and indices have the following meaning:

m: 0, 1, 2 or 3, in some cases 2, or $R_1$: $C_1$ to $C_{10}$ hydrocarbon residue, in some cases a $C_1$ to $C_{10}$ hydrocarbon chain, which can be interrupted by oxygen or nitrogen, in some cases methyl, ethyl or i- or n-propyl, in some cases i- or n-propyl, $R_2$: the same or different hydrolysable groups, in some cases alkoxy groups such as methoxy, ethoxy, n-propoxy, i-propoxy, n-butoxy, i-butoxy or t-butoxy, in some cases methoxy or ethoxy, $R_3$: the same or different $C_1$ to $C_5$ alkyl groups, in some cases methyl, ethyl or i- or n-propyl, in some other cases i- or n-propyl, and X: functional polymerizable group, in some cases an unsaturated organic residue in w position, such as an unsaturated alkenyl group in w position with 1 to 10, in some other cases 2 to 4 C-atoms or an unsaturated carboxylic acid residue in w position of carboxylic acids with up to 4 hydrocarbon atoms and alcohols with up to 6 carbon atoms.

Particularly suitable residues X comprise, e.g., vinyl, alkyl vinyl, in some cases methyl, ethyl or propyl vinyl, (meth)acryloxyalkyl, in some cases (meth)acryloxymethyl, (meth)acryloxyethylene or (meth)acryloxypropyl, in some cases (meth)acryloxypropyl.

In one appropriate embodiment of the method according to the present disclosure, it is provided that the organic silicone compound is fed via a feed line from a container of the application system, in some cases a vacuum chamber, which is outside this application system for depositing a metal layer, in some cases outside the vacuum chamber of the vacuum vapor deposition system. It is also possible for a dyeing agent, in some cases a dye, to be added to the organic silicone compound. Accordingly, in one further embodiment, the methods according to the present disclosure are also characterized by the fact that together with the at least one organic silicone compound, in some cases for the plasma polymerization, at least one dyeing agent, in some cases one dye, is added to the application system for depositing a metal layer, in some other cases in the form of a mixture.

Accordingly, in order to implement the method according to the present disclosure, an application system can be used for depositing a metal layer, comprising at least one container for holding an organic silicone compound, in some cases outside the application system, for the application of a metal layer, in some cases outside the vacuum chamber of the vacuum vapor deposition system, with a feed line to the application system, in some cases to the vacuum chamber.

In some cases, good adhesion without limitations with regard to corrosion resistance can also be achieved when the step of treatment with at least one organic silicone compound such as hexamethyldisiloxane, in some cases by way of plasma polymerization, is conducted forming a polysiloxane layer in the presence of at least one reactive gas, such as oxygen, nitrogen, carbon dioxide, hydrogen, carbon monoxide, hydrogen peroxide gas, water vapor, ozone and/or air, in some cases in the presence of oxygen or air. Via the inclusion of reactive gases, in some cases air or oxygen in the, in some cases plasma generated, polymerization process, harder polysiloxane layers are obtained than with the standard production of such polysiloxane layers without the additional use of the reactive gas described. These harder polysiloxane layers are also characterized by greater diffusion closeness. Here, in at least one embodiment, it can be provided that the at least one organic silicone compound, in some cases hexamethyldisiloxane, and the at least one reactive gas, in some cases oxygen or air, are used as a mixture for the treatment step. The embodiment described above of the additional use of reactive gases with the, in some cases plasma generated, production of the polysiloxane layer, is in some other cases used with at least one step in the treatment with at least one organic silicone compound, in some cases by way of plasma polymerization, forming a polysiloxane layer or also for every step for the production of a polysiloxane layer. In some cases, this method variant is used for the production of coated metallic substrates and for the production of coated non-metallic substrates, in some cases plastic substrates, in method step m) and/or s). In method step n), which follows the aforementioned method step m), the plasma treatment is in some other cases conducted with the aid of a plasma gas formed from an inert gas, in some cases argon, and in the method step t), which follows the aforementioned method step s), the plasma treatment is in some other cases conducted with the aid of a plasma gas formed from oxygen or air or nitrogen, in some cases oxygen. This approach also contributes to improved adhesion of the overall system.

In general, several method variants can be selected for the plasma treatment step. According to a first variant, the plasma can be formed using at least one inert gas, in some cases argon. Alternatively, in order to generate a suitable plasma, mixtures of at least one inert gas, in some cases argon, and a reactive gas such as oxygen, nitrogen, carbon dioxide, hydrogen, carbon monoxide, hydrogen peroxide gas, water vapor, ozone and/or air can be used. In some other cases, here, oxygen and nitrogen, in some cases oxygen, are used. Finally, it is also possible to use only reactive gases such as oxygen, nitrogen, hydrogen, carbon dioxide, carbon monoxide, hydrogen peroxide gas, water vapor, ozone and/or air, to the exclusion of inert gases, in order to produce the plasma. In some cases, oxygen is used in this case. With the aid of plasma treatment with the plasma generator, the surface of the substrate to be coated is activated. With one plasma method, an energy-rich plasma generally acts on the surface of the molded part such that active centers are formed on this surface. These can, for example, be hydroxy groups and/or carbonyl groups.

Accordingly, in at least one further embodiment of the method according to the present disclosure, it can be provided that the step of plasma treatment with the plasma generator is conducted with the use of at least one inert gas, in some cases argon, or with the use of at least one inert gas, in some cases argon, and oxygen, nitrogen, carbon dioxide, hydrogen, carbon monoxide, hydrogen peroxide gas, water vapor, ozone and/or air, in some cases oxygen, or with the use of oxygen, nitrogen, hydrogen, carbon dioxide, carbon monoxide, hydrogen peroxide gas, water vapor, ozone and/or air, in some cases oxygen, in some other cases to the exclusion or inert gases.

Here, method variants are in some cases provided in which the, in some cases every, plasma treatment with the plasma generator and/or the, in some cases every, deposition of the first and second metal layer and/or the, in some cases every, deposition of the layer obtained through plasma treatment of organic silicone compounds, in some cases the polysiloxane layer, is conducted in the application system for deposing a metal layer, in some cases in the vacuum vapor deposition system or in the sputter system. In some cases, here, the aforementioned method steps e), l), m), n) and s) are conducted under vacuum.

The present disclosure also provides in some cases a method in which the plasma treatment is conducted according to step d) and/or p), in some cases according to step d) and p), using argon, in at least one embodiment to the exclusion of air or oxygen, and/or in some other cases and, in which the plasma treatment is conducted according to step n) and/or t), in some further cases according to step n) and t), using oxygen, in at least one embodiment to the exclusion of inert gases such as argon.

The method according to the present disclosure offers a major advantage that nearly all method steps can be conducted in the application system for depositing a metal layer. In addition to the deposition of the first and second metal layer, this also relates to the activation of surfaces by way of the plasma treatment with the plasma generator as well as the deposition of the layer formed from organic silicone compounds, in some cases the polysiloxane layer, in some cases by way of plasma polymerization. Only the cleaning steps, the deposition of the primer layer and the deposition of the cover layer are generally conducted outside the aforementioned application system. Accordingly, it can be provided that the, in some cases every, plasma treatment with the plasma generator and/or the, in some cases each, deposition of the first and second metal layer and/or the, in some cases each, deposition of the layer formed from organic silicone compounds, in some cases the polysiloxane layer, is conducted in the application system for depositing a metal layer, in some cases in the vacuum vapor deposition system or in the sputter system. Here, in some cases, the, in some other cases each, plasma treatment with the plasma generator and/or the, in some cases each, application of the first and second metal layer and the, in some cases each, application of the layer formed from organic silicone compounds, in some cases the polysiloxane layer, is conducted in the application system for the application of a metal layer, in some cases under vacuum vapor deposition system or in the sputter system. In some cases, in at least one embodiment of the method according to the present disclosure, the deposition of the primer layer and/or, in some cases and, the deposition of the cover layer are conducted outside the application system for depositing a metal layer, in some cases the vacuum vapor deposition system or the sputter system.

For the cover layer, use can, e.g., also be made of water-soluble coating compositions. The cover layer can be formed from polyacrylic resins, polyester resins, aminoplast resins or polyurethane compounds. In some cases, with the methods according to the present disclosure, such cover layers are applied that are based on a UV-hardened coating material. Accordingly, a suitable cover layer can be a UV-hardened cover layer. The cover layer can be obtained, e.g., using a clear finish or a transparent powder. In some cases, the cover layer is deposited using a wet finish method or powder coating method. Accordingly, the cover layer can for example be one-, two- or multiple component finishes, wherein clear finishes are provided in at least one embodiment. These clear finishes can be, e.g., chemically moistening dual-component, single-component thermal hardening or UV-hardened finishes. Additionally, 1K or 2K baking varnish can be used for the cover layer. In general, in at least one embodiment, the materials used for the primer layer and the cover layer can also be the same.

Additionally, it was surprisingly found that in the method according to the present disclosure, the step of applying the cover layer can also be conducted by way of electrostatic finishing. This leads to a further reduction in the quantity of coating material required for the cover layer. In this way, too, a very even coating deposition can be secured. Further, in this manner, so-called all-round finishing can be achieved far more effectively, i.e., those areas are also coated that are not accessible, or only accessible to a limited extent, via direct spraying deposition.

Generally, the cover layer has a thickness in the range of 10 to 50 µm, in some cases in the range of 20 to 30 µm. It is of essential importance to the present disclosure for the method according to the present disclosure that the material that forms the cover layer is deposited onto an activated polysiloxane layer that has previously been obtained by way of plasma treatment or corona treatment, which in turn has in some cases been obtained through plasma polymerization, and is in some further cases deposited essentially without a time delay.

The plasma treatment with the plasma generator is occasionally also referred to as smoldering.

In order to apply the metal layers, use can be made, for example, of the Physical Vapor Deposition (PVD), Chemical Vapor Deposition (CVD) techniques, vapor deposition using an electron beam evaporator, vapor deposition using a resistance evaporator, induction vapor deposition, ARC vapor deposition or cathode or anode sputtering (sputter coating). Accordingly, in some cases, vacuum vapor deposition systems or sputter systems can potentially be used as application systems for deposing a metal layer. Suitable vacuum vapor deposition systems expediently comprise PVD systems (Physical Vapor Deposition), CVD systems (Chemical Vapour Deposition), electron beam evaporators, resistance evaporators, induction evaporators and ARC evaporators. Suitable sputter systems comprise cathode sputterers and anode sputterers, for example. As is known to persons skilled in the art, a metal layer mainly consists of metal. This does not entirely exclude additives, such as those used in the form of carbon for stainless steel. In some cases, the metal share of the present metal layer is greater than 90 weight %, in some other cases 95 weight % and in some further cases ≥98 weight %. Naturally, the first and second metal layer can also be applied with methods that differ from one another. In some cases, recourse is made to the same method for the application of the first metal layer and the second metal layer.

In some cases, the metal layer is a vapor deposited or sputtered metal layer, in some other cases a PVD metal layer. With the PVD method, resistance-heated metal coil or metal shuttle evaporators are used, wherein tungsten coils in a wide range of different forms are provided in some cases. With the PVD method, in general, an evaporator is fitted with coils that can be clamped to evaporator rails that are insulated from each other. In some cases, a precisely determined quantity of metal to be evaporated is added to each coil. Following closure and evacuation of the PVD system, the evaporation can be started by switching on the power supply, as a result of which the evaporator rails cause the coils to glow. The solid material starts to melt and fully moistens the usually twisted coils. Through the further addition of energy, the liquid metal is transferred to the gas phase, so that it can be deposited on the substrate to be coated. The thickness of the metal layer, and thus also the appearance of this layer, can be specifically set via the quantity of metal transferred to the gas phase.

A further method for depositing the metal layer onto the substrate is cathode sputtering (sputtering method). Here, a cathode is disposed in an evacuated container, which is connected with the negative pole of a power supply. The coating material that is sputtered is mounted directly in front of the cathode and the substrates to be coated are disposed opposite the coating material to be sputtered. Further, argon can be guided through the container as a process gas, said container finally also having an anode that is connected with the positive pole of a power supply. After the container has been evacuated in advance, the cathode and anode are connected with the power supply. Through the targeted and controlled inflow of argon, the average free path length of the charge carrier is significantly reduced. In the electrical field between cathode and anode, argon atoms are ionized. The positively charged particles are accelerated at high energy towards the negatively charged cathode. On impact and through particle collisions in the coating material, said material is transferred to the vapor phase, is accelerated into the free space at high energy and then condenses onto the substrates to be coated. The sputter method can be used to specifically set different metal layer thicknesses.

The metal layers obtainable with the aforementioned methods and systems in some cases have an average, in some other cases absolute, thickness in the range of 1 nm to 150 nm, in some cases in the range of 5 nm to 120 nm. In one embodiment of the coated substrate according to the present disclosure, the metal layer is set with a thickness in the range of 60 nm to 120 nm, in some cases with a thickness in the range of 75 nm to 110 nm. With these thicknesses, the metal layer, in some other cases the aluminum layer, lies on the surface such that it covers it, i.e., it is not transparent or translucent. As a result, high-gloss layers can be obtained.

According to a further embodiment of the method according to the present disclosure, the second metal layer deposited with the application system, in some cases the aluminum layer, is applied in step q), in some cases vapor deposited or sputtered, in such a thickness that said metal layer, in some cases also after step r), s), t) and/or u), or after step s), t) and/or u), is transparent or translucent for visible light. Alternatively, and in some cases in addition, it can here be provided that the first metal layer deposited with the application system, in some cases the aluminum layer, is applied in step k), in some cases vapor deposited or sputtered, in such a thickness that said metal layer is non-transparent or non-translucent for visible light.

A dyeing of the coating present on the non-metallic and metallic substrates can also be achieved with the method according to the present disclosure in such a manner that for the application of the cover layer, a coating material containing at least one dyeing agent, e.g., at least one pigment and/or at least one dye, is used. Persons skilled in the art can also use known glazes in order to dye the cover layer, for example to obtain brass, titanium and gold tones or individual color tones such as red, blue, yellow, green, etc., or epoxy color tones. For example, special effect pigments such as pearl gloss pigments, LCP (liquid crystal polymer) pigments or OV (optical variable) pigments can also be incorporated into the cover layer.

The present disclosure further provides a coated metallic or non-metallic substrate, in some cases obtained or obtainable according to the method according to the present disclosure, comprising:

A) a, in some cases cleaned, in some other cases degreased, metallic or non-metallic substrate, K) at least one, in some cases one, first metal layer deposited with an application system by way of vapor deposition and/or sputter technology, O) at least one, in some cases one, primer layer, Q) at least one, in some cases one, second metal layer deposited with an application system by way of vapor deposition and/or sputter technology, and U) at least one, in some cases one, in some cases transparent and/or dyed, cover layer;

or

A) a, in some cases cleaned, in some other cases degreased, metallic or non-metallic substrate, K) at least one, in some cases one, first metal layer deposited with an application system by way of vapor deposition and/or sputter technology, M) at least one, in some cases one layer formed from at least one organic silicone compound, in some cases by way of plasma polymerization, in some cases a polysiloxane layer, O) at least one, in some cases one, primer layer, Q) at least one, in some cases one, second metal layer deposited with an application system, in some cases by way of vapor deposition and/or sputter technology, S) at least one, in some cases one layer formed from at least one organic silicone compound, in some cases by way of plasma polymerization, in some cases a polysiloxane layer, and U) at least one, in some cases one, in some cases transparent and/or dyed, cover layer;

or

A) a, in some cases cleaned, in some other cases degreased, metallic or non-metallic substrate, G) at least one, in some cases one, primer layer, K) at least one, in some cases one, first metal layer deposited with an application system, in some cases by way of vapor deposition and/or sputter technology, with a plasma, in some cases an argon and/or oxygen plasma, treated under vacuum or corona treated, in some cases plasma treated, Q) at least one, in some cases one second metal layer deposited with an application system, in some cases by way of vapor deposition and/or sputter technology, S) at least one, in some cases one layer formed from at least one organic silicone compound, in some cases by way of plasma polymerization, in some cases a polysiloxane layer, and U) at least one, in some cases one, in some cases transparent and/or dyed, cover layer;

or

A) a, in some cases cleaned, in some other cases degreased, metallic or non-metallic substrate, G) optionally at least one, in some cases one, primer layer, K) at least one, in some cases one, first metal layer deposited with an application system, in some cases by way of vapor deposition and/or sputter technology, in some cases with a plasma, in some cases an argon and/or oxygen plasma, treated under vacuum or corona treated, in some cases plasma treated, M) at least one, in some cases one, layer formed from at least one organic silicone compound, in some cases by way of plasma polymerization, in some cases a polysiloxane layer, O) at least one, in some cases one, primer layer, Q) at least one, in some cases one, second metal layer deposited with an application system, in some cases by way of vapor deposition and/or sputter technology, S) at least one, in some cases one, layer formed from at least one organic silicone compound, in some cases by way of plasma polymerization, in some cases a polysiloxane layer, and U) at least one, in some cases one, in some cases transparent and/or dyed, cover layer.

In some cases coated metal substrates according to the present disclosure and coated non-metal substrates according to the present disclosure are provided in which the metallic or non-metallic substrate to be coated according to A) is a substrate treated under vacuum with a plasma, in some cases argon plasma, and/or in which the layer formed from at least one organic silicone compound, in some cases the polysiloxane layer according to C) is a layer treated under vacuum with a plasma, in some cases an oxygen plasma, and/or in which the primer layer according to G) is a primer layer treated under vacuum with a plasma, in some cases an argon plasma, and/or in which the primer layer according to O) is a primer layer treated under vacuum with a plasma, in some cases an argon plasma, and/or in which the metal layer K) is a metal layer treated under vacuum with a plasma, in some cases an oxygen and/or argon plasma, and/or in which the second metal layer Q) is a metal layer treated under vacuum with a plasma, in some cases an oxygen and/or argon plasma, and/or in which the layer formed from at least one organic silicone compound, in some cases the polysiloxane layer, according to M) is a layer treated under vacuum with a plasma, in some cases an argon and/or oxygen plasma, and/or in which the layer formed from at least one organic silicone compound, in some cases the polysiloxane layer, according to S) is a layer treated under vacuum with a plasma, in some cases an argon and/or oxygen plasma.

In this case, such coated metallic and non-metallic substrates are particularly suitable in which the metallic or non-metallic substrate to be coated according to A) is a substrate treated under vacuum with a plasma, in some cases an argon plasma, and in which the layer formed from at least one organic silicone compound, in some cases the polysiloxane layer according to C) is a layer treated under vacuum with a plasma, in some cases an oxygen plasma, and in which the primer layer according to D) is a primer layer treated under vacuum with a plasma, in some cases an argon plasma, and in which the layer formed from at least one organic silicone compound, in some cases the polysiloxane layer according to F) is a layer treated under vacuum with a plasma, in some cases an oxygen plasma.

For the implementation of the method according to the present disclosure, use can also be made of an application system for depositing a metal layer, comprising or consisting of a vacuum vapor deposition system with a vacuum chamber, and at least one, in some cases one, plurality of first heatable holding units, in some cases bowls, shuttles or coils, in each case interacting with a heating facility or comprising or consisting of a heating facility, in each case designed and suitable for holding a metal or a metal alloy, and further a control facility for setting the melting or evaporation temperature.

Here, it can be provided in at least one embodiment that the application system for depositing a metal layer comprises at least one container, in some cases outside the vacuum chamber of the vacuum vapor deposition system, for holding an organic silicone compound, with a feed line to the vacuum chamber.

It has been shown to be appropriate in some cases when the application system for depositing the first and/or second metal layer is also equipped with at least one frame, in some cases present under vacuum chamber, with a longitudinal orientation and with at least one carrier, in some cases in the form of a shaft, which is essentially aligned along the longitudinal orientation of the frame, designed and fitted to hold at least one, in some cases a plurality, of non-metallic and/or metallic substrates, wherein the frame and/or the at least one carrier are rotated around an, in some cases essentially horizontally aligned, axis. Suitable frames that can be used with the application system are described for example in EP 2 412 445 and DE 20 2007 016 072.

The coated non-metallic and metallic substrates obtainable according to the method according to the present disclosure can for example be used as accessory parts in car manufacture, motorcycle manufacture, bicycle manufacture or shipbuilding, for mud guards, in some cases light metal mud guards, wheels, in some cases light metal wheels or as a component thereof, for sanitary facilities objects, in some cases as tap fittings, or as a component thereof, for car body interior or exterior parts or as a component thereof, for handles or handle components, in some cases door handles or as a component thereof, for profiles or frames, in some cases window frames or as a component thereof, for fittings systems or as a component thereof, in some cases signs and door signs, for housing or as packaging or as a component hereof, for interior and exterior parts of ships or as a component thereof, for decorative objects or as a component thereof, for high-quality parts or as a component thereof, for indoor and outdoor furniture or for components thereof, for household appliances, in some cases coffee machines or as a component thereof, for interior or exterior parts of airplanes or as a component thereof, for interior or exterior parts of buildings or as a component thereof, for radiators or pipes or as a component thereof, for parts of elevators or as a component thereof, for parts of electronics components or appliances or as a component thereof, for parts of kitchen appliances such as coffee machines, or as a component of communication components or appliances, in some cases cellphones, or as a component thereof.

The coated substrates according to the present disclosure, or the coated substrates obtainable according to the method according to the present disclosure, generally pass the steam jet test, e.g., according to DIN EN ISO 16925:2014-06, the condensate constant climate test, e.g., according to DIN EN ISO 6270-2, the hydrolysis test, e.g., according to BMW norm AA-0203 or AA-P 308, the salt spray test, e.g., according to DIN EN ISO 9227 and/or the cross cutting test, e.g., according to DIN EN ISO 2409:2013-06. In some other cases, all or nearly all of the above tests can be passed.

The present disclosure is based on the surprising finding that with the substrates according to the present disclosure, in some cases with the substrates obtainable according to the method according to the present disclosure, a high-quality gloss coating is provided that permanently retains its shine. Additionally, it was surprisingly found that the substrates according to the present disclosure, such as the coated non-metallic and metallic substrates obtainable according to the method according to the present disclosure, are equipped with excellent corrosion resistance. The coated substrates obtainable according to the method according to the present disclosure are additionally characterized by exceptionally good adhesion. Accordingly, these coated substrates show outstanding corrosion resistance even if the surfaces are subjected to mechanical damage, such as impact from stones or scratching. A further advantage brought by the method according to the present disclosure and the application system according to the present disclosure is that only very short refitting periods are required in order to coat new substrate batches. Furthermore, the method according to the present disclosure makes it possible to significantly reduce the size of the overall system for the production of coated substrates, starting from the not yet cleaned substrate to be coated, so that considerably less space is required compared to standard systems. Furthermore, with the method according to the present disclosure, it is possible to significantly reduce the processing time through to completion of the coated, market-ready substrate. This inevitably means that cycle times are reduced.

It is also a very particular, surprising advantage that the coated substrates according to the present disclosure, in some cases the coated substrates produced with the method according to the present disclosure, show neither raised edges nor edge loss, or almost no raised edges and almost no edge loss, and at the same time also entail a significantly reduced proportion of reject goods in mass production. It is possible, in a reliable and reproducible manner, to identically reconstruct even high-quality chrome surfaces without using chrome or other heavy metals. With the method according to the present disclosure, the use of coating material for the primer layer and also of coating material for the cover layer can be significantly reduced, for example by at least 50 and in many cases even by at least 70 weight %. Nevertheless, a covering application is reliably obtained in which the spread of the coating material meets very high standards. Finally, the aforementioned advantages are surprisingly obtained even with a reduction of the pretreatment or cleaning steps and/or with a reduction of the level of pretreatment or cleaning effort.

The features of the present disclosure disclosed in the above description and in the claims can be essential both individually and in any combination required for the realization of the present disclosure in its different embodiments.

The various embodiments described above can be combined to provide further embodiments. All of the foreign patents and foreign patent applications referred to in this specification and/or listed in the Application Data Sheet are incorporated herein by reference, in their entirety. Aspects of the embodiments can be modified, if necessary to employ concepts of the various patents and applications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for producing a coated metallic substrate or a coated non-metallic substrate, comprising:
   providing a metallic substrate or a non-metallic substrate with at least one at least partially coatable surface,
   applying a vacuum to the metallic substrate or the non-metallic substrate and treating, by a plasma treatment with a plasma generator, the metallic substrate or the non-metallic substrate, under vacuum,
   depositing at least one first metal layer, containing or consisting of one a first metal selected from the group consisting of aluminum, silver, gold, lead, vanadium, manganese, magnesium, iron, cobalt, nickel, copper, chromium, palladium, molybdenum, tungsten, platinum, titanium, zirconium and zinc, or containing or consisting of a first metal alloy selected from the group consisting of brass, bronze, steel, aluminum, magnesium and titanium alloys, with an application system onto the metallic or non-metallic substrate
   treating the at least one first metal layer with at least one organic silicone compound, forming a polysiloxane layer (A),
   treating the polysiloxane layer (A) with a plasma treatment using the plasma generator,
   depositing at least one primer layer (A) onto the polysiloxane layer (A),
   applying a vacuum to the at least one primer layer (A) and treating, by a plasma treatment with the plasma generator, the at least one primer layer (A) under vacuum,
   depositing at least one second metal layer, containing or consisting of a first metal selected from the group consisting of aluminum, silver, gold, lead, vanadium, manganese, magnesium, iron, cobalt, nickel, copper, chromium, palladium, molybdenum, tungsten, platinum, titanium, zirconium and zinc, or containing or consisting of a second metal alloy selected from the group consisting of brass, bronze, steel, aluminum, magnesium and titanium alloys, with the application system onto the plasma-treated at least one primer layer (A),
   treating the at least one second metal layer with at least one organic silicone compound, forming a polysiloxane layer (B),
   treating the polysiloxane layer (B) with a plasma treatment using the plasma generator, and
   depositing at least one cover layer onto the plasma-treated polysiloxane layer (B).

2. The method according to claim 1, wherein the non-metallic substrate comprises glass, stone materials, ceramic, compound fiber materials, carbon materials, plastic or wood, or consists thereof, or wherein the metallic substrate comprises or consists of metals or metal alloys selected from the group consisting of aluminum, aluminum alloys, iron, iron alloys, copper, copper alloys, titanium, titanium alloys, zinc, zinc alloys, nickel, nickel alloys, molybdenum, molybdenum alloys, magnesium, magnesium alloys, lead, lead alloys, tungsten, tungsten alloys, manganese, manganese alloys, brass, bronze, nickel pressure casting, zinc pressure casting and aluminum pressure casting or any mixtures thereof.

3. The method according to claim 1, wherein the at least one organic silicone compound comprises at least one amino-containing silane.

4. The method according to claim 1, wherein the plasma treatment with the plasma generator and the deposition of the at least one first metal layer and the at least one second metal layer and the formation of the polysiloxane layer through a plasma treatment of organic silicone compounds, are conducted in the application system.

5. The method according to claim 1, wherein the cover layer comprises or consists of polyacrylic resins, polyester resins, aminoplast resins or polyurethane compounds, and wherein the cover layer is formed from a UV-hardened coating material or from a 1K or 2K baking varnish.

6. The method according to claim 1, wherein the first and second metal layer are deposited using Physical Vapor Deposition, Chemical Vapor Deposition, vapor deposition using an electron beam evaporator, vapor deposition using a resistance evaporator, induction vapor deposition, ARC vapor deposition or cathode or anode sputtering.

7. The method according to claim 1, wherein the plasma treatment with the plasma generator, or the treatment with the at least one organic silicone compound forming a polysiloxane layer, or depositing the at least one first metal layer and the at least one second metal layer, is conducted under vacuum with the application system.

8. The method according to claim 1, wherein the plasma treatment of the metallic substrate or the non-metallic substrate or of the at least one primer layer (A) is conducted using argon, or wherein the plasma treatment of the polysiloxane layer (A) or the polysiloxane layer (B) is conducted using oxygen.

9. The method according to claim 1, wherein:
the at least one second metal layer deposited with the application system is deposited in such a thickness that said at least one second metal layer is transparent or translucent for visible light, or
the at least one first metal layer deposited with the application system is deposited in such a thickness that said at least one first metal layer is non-transparent or non-translucent for visible light.

10. The method according to claim 1, wherein the at least one primer layer (A) or the at least one cover layer is deposited according to a wet finish method or a powder coating method.

11. The method according to claim 1, wherein the at least one primer layer (A) or the cover layer is deposited by way of electrostatic finishing.

12. A coated metallic or non-metallic substrate obtained according to claim 1, comprising:
A) a metallic or non-metallic substrate,
K) at least one first metal layer deposited with an application system,
O) at least one primer layer,
Q) at least one second metal layer deposited with an application system, and
U) at least one cover layer;
or
A) a metallic or non-metallic substrate,
K) at least one first metal layer deposited with an application system,
M) at least one first polysiloxane layer formed from at least one organic silicone compound,
O) at least one primer layer,
Q) at least one second metal layer deposited with an application system,
S) at least one second polysiloxane layer formed from at least one organic silicone compound, and
U) at least one cover layer;
or
A) a metallic or non-metallic substrate,
G) at least one primer layer,
K) at least one first metal layer deposited with an application system with a plasma treated under vacuum,
Q) at least one second metal layer deposited with an application system,
S) at least one polysiloxane layer formed from at least one organic silicone compound, and
U) at least one cover layer;
or
A) a metallic or non-metallic substrate,
G) at least one first primer layer,
K) at least one first metal layer deposited with an application system with a plasma treated under vacuum,
M) at least one first polysiloxane layer formed from at least one organic silicone compound,
O) at least one second primer layer,
Q) at least one second metal layer deposited with an application system,
S) at least one second polysiloxane layer formed from at least one organic silicone compound, and
U) at least one cover layer.

13. The coated metallic or non-metallic substrate according to claim 12, wherein:

the metallic or non-metallic substrate to be coated according to A) is a substrate treated under vacuum with a plasma, and/or
the at least one first primer layer according to G) is a primer layer treated under vacuum with a plasma, and/or
the at least one second primer layer according to O) is a primer layer treated under vacuum with a plasma, and/or
the at least one first metal layer is a metal layer treated under vacuum with a plasma, and/or
the at least one second metal layer is a metal layer treated under vacuum with a plasma, and/or
the at least one first polysiloxane layer formed from at least one organic silicone compound is a layer treated under vacuum with a plasma, and/or
the at least one second polysiloxane layer (A) or (B) formed from at least one organic silicone compound is a layer treated under vacuum with a plasma.

14. The method according to claim 1, further comprising, prior to said applying a vacuum and said treating by a plasma treatment, cleaning the at least one at least partially coatable surface.

15. The method according to claim 1, further comprising, after said applying a vacuum and said treating by a plasma treatment, treating the metallic substrate or non-metallic substrate with at least one organic silicone compound, forming a polysiloxane layer (C).

16. The method according to claim 15, further comprising treating the polysiloxane layer (C) with a plasma treatment using the plasma generator.

17. The method according to claim 1, further comprising, after said applying a vacuum and said treating by a plasma treatment, depositing at least one primer layer (B) onto the metallic substrate or the non-metallic substrate.

18. The method according to claim 15, further comprising depositing at least one primer layer (B) onto the polysiloxane layer (C).

19. The method according to claim 16, further comprising depositing at least one primer layer (B) onto the plasma-treated polysiloxane layer (C).

20. The method according to claim 17, further comprising:
applying a vacuum to the metallic substrate or the non-metallic substrate; and
treating, by a plasma treatment with the plasma generator, the metallic substrate or the non-metallic substrate, under vacuum.

21. The method according to claim 17, further comprising treating the at least one primer layer (B) with at least one organic silicone compound, forming a polysiloxane layer (D).

22. The method according to claim 20, further comprising treating the at least one primer layer (B) with at least one organic silicone compound, forming a polysiloxane layer (D).

23. The method according to claim 21, further comprising treating the polysiloxane layer (D) with a plasma treatment using the plasma generator.

24. The method according to claim 1, further comprising, after said depositing the at least one first metal layer, treating the at least one first metal layer with a plasma treatment using the plasma generator.

25. The method according to claim 1, further comprising, after said depositing the at least one second metal layer, treating the at least one second metal layer with a plasma treatment using the plasma generator.

26. The method according to claim 6, wherein said depositing the at least one first metal layer or the at least one second metal layer comprises vapor depositing the first or second metal, or the first or second metal alloy, respectively, with the application system.

27. The method according to claim 15, wherein the at least one first metal layer is deposited onto the polysiloxane layer (C) on the metallic substrate or the non-metallic substrate.

28. The method according to claim 16, wherein the at least one first metal layer is deposited onto the plasma-treated polysiloxane layer (C) on the metallic substrate or the non-metallic substrate.

29. The method according to claim 17, wherein the at least one first metal layer is deposited onto the at least one primer layer (B) on the metallic substrate or the non-metallic substrate.

30. The method according to claim 20, wherein the at least one first metal layer is deposited onto the plasma-treated at least one primer layer (B) on the metallic substrate or the non-metallic substrate.

31. The method according to claim 21, wherein the at least one first metal layer is deposited onto the polysiloxane layer (D) on the metallic substrate or the non-metallic substrate.

32. The method according to claim 23, wherein the at least one first metal layer is deposited onto the plasma-treated polysiloxane layer (D) on the metallic substrate or the non-metallic substrate.

* * * * *